United States Patent [19]

Taniguchi et al.

[11] Patent Number: 5,034,924
[45] Date of Patent: Jul. 23, 1991

[54] STATIC RANDOM ACCESS MEMORY DEVICE WITH PULL-DOWN CONTROL CIRCUIT

[75] Inventors: Hitoshi Taniguchi; Keisuke Ishio, both of Kanagawa, Japan

[73] Assignee: Sony Corporation, Tokyo, Japan

[21] Appl. No.: 67,975

[22] Filed: Jun. 30, 1987

[30] Foreign Application Priority Data

Jun. 30, 1986 [JP] Japan .................. 61-153311

[51] Int. Cl.$^5$ ............................................ G11C 11/419
[52] U.S. Cl. ............................ 365/189.11; 365/154; 365/230.03
[58] Field of Search .............. 365/154, 189, 205, 230, 365/189.11, 230.03

[56] References Cited

U.S. PATENT DOCUMENTS

| | | | |
|---|---|---|---|
| 4,455,627 | 6/1984 | Oritari | 365/226 |
| 4,621,315 | 11/1986 | Vaughn et al. | 363/60 |
| 4,636,991 | 1/1987 | Flannagan et al. | 365/230 |
| 4,665,507 | 5/1987 | Gondou et al. | 365/190 |
| 4,730,279 | 3/1988 | Ohtani | 365/230 |
| 4,791,613 | 12/1988 | Hardee | 365/189 |

FOREIGN PATENT DOCUMENTS 0139385 5/1985 European Pat. Off. .

OTHER PUBLICATIONS

Third Caltech Conference on Very Large Scale Integration, Mar. 23-23, 1983, pp. 278-285.

Primary Examiner—James W. Moffitt
Attorney, Agent, or Firm—Hill, Van Santen, Steadman & Simpson

[57] ABSTRACT

A static RAM includes a plurality of chips. The chips each comprise a plurality of memory cells for storing data, column-selecting transistors, bit-lines to which the plurality of memory cells and the column-selecting transistors are connected, and a voltage control circuit which can adjust the electrical potential of the bit-lines so as to allow the column-selecting transistors to operate when selecting one of the chips. By use of the voltage control circuit, the static RAM can operate at a high speed when not only address selecting operation but also chip selecting operation is required.

4 Claims, 3 Drawing Sheets

3 ADDRESS INPUT TERMINAL

STATIC RANDOM ACCESS MEMORY DEVICE WITH PULL-DOWN CONTROL CIRCUIT

BACKGROUND OF THE INVENTION

The present invention relates to a static random-access memory (RAM) device. More specifically, the invention relates to a static random-access memory device which can select a chip at a high speed.

DESCRIPTION OF THE PRIOR ART

Conventionally, RAMs are organized using a plurality of chips in order to increase memory capacity. In such RAMs, address data designates a selected memory cell, and chip selection for designating a selected chip is also performed. For example, a 128K bit static RAM is comprised of two chips each having 64K bit memory cells. In this case, a 17-bit signal is used as an address signal supplied to the address input terminals. The most significant bit is used as a chip selection signal $\overline{CS}$ which is supplied to the respective chips by means of a decoder, so as to designate which one of the chips is to be used. The other 16-bits are supplied to the chip to be used as an address signal AD to designate the memory-cell accessed. The data stored in the chip which is selected by the chip selecting signal, at the memory cell which is selected by the 16-bit address signal AD, are then outputted to an output terminal.

A high-speed static RAM comprised of one chip, which includes memory cells each comprising a flip-flop circuit made of, for example, MOSFETs, has been proposed. In this conventional high-speed SRAM, for example, 64 memory cells, the number which is actually equal to the memory capacity, are arranged in the form of a lattice. One of the memory cells is selected by address input signals comprising X (line) and Y (column) signals.

According to this static RAM, when selecting an address, address signals AD are detected to produce equalizing signals $\overline{\phi}_{EQ}$. In response to the equalizing signals $\overline{\phi}_{EQ}$, the electrical potentials of bit lines assume an intermediate potential between the high-level Hi electrical potential and the low-level Lo electrical potential. Therefore, both column-selecting transistors are ON. In this case, the electrical potential of both data lines have an intermediate potential between the high-level Hi and low-level Lo electrical potentials. At this time, data signals are outputted from the memory cell which is selected by column-selecting signals, and line-selecting signals produced from the Y and X decoders, respectively, are rapidly transferred to the data lines from the bit lines. These data signals are supplied to the data output terminal by means of a common data line, and so forth.

However, when selection of one of plural chips is necessary, both of the bit lines are at a high-level, so that both of the column-selecting transistors are OFF at the time the chip is accessed. Therefore, operation is impeded until the electrical potentials of the bit lines are decreased to a given level, and thus the transferring of the data signals from the bit lines to the data lines is delayed. Therefore, there is a disadvantage in that the transfer rate of data signals is decreased when selecting between the chips is necessary, as compared with when only selecting an address is necessary. This makes designing a high-speed static RAM difficult.

SUMMARY OF THE INVENTION

It is therefore an object to eliminate the aforementioned disadvantage and to provide a SRAM which can operate at a high speed, when not only address selecting operations but also chip selecting operations are required.

In order to accomplish the aforementioned and other specific objects, a static random-access memory device according to the present invention includes a voltage control circuit which can adjust the electrical potential of bit-lines to allow a column-selecting transistor to operate while selection of one of the chips is performed.

According to one aspect of the present invention, a static random-access memory device, which has a plurality of chips, comprises:

a plurality of memory cells for storing data in the chips;

column-selecting transistors in the chips;

bit-lines, to which the plurality of memory cells and the column-selecting transistors are connected; and a voltage control circuit which adjusts the electrical potential of said bit-lines so as to allow a column-selecting transistor to operate when selecting one of the chips.

The voltage control circuit may be a pull-down circuit. Preferably, the voltage control circuit comprises n-channel MOSFETs, the drains of which are connected to the bit lines, with the sources being connected to ground and the gates being connected to each other. In addition, the static random-access memory device further comprises a bit-line equalizing circuit and a data-line load circuit.

BRIEF DESCRIPTION OF THE DRAWINGS

The present invention will be understood more fully from the detailed description given herebelow and from the accompanying drawings of the preferred embodiment of the invention. The drawings are not intended to imply limitation of the invention to this specific embodiment, but are for explanation and understanding only.

In the drawings.

DESCRIPTION OF THE PREFERRED EMBODIMENT

Figure 1:
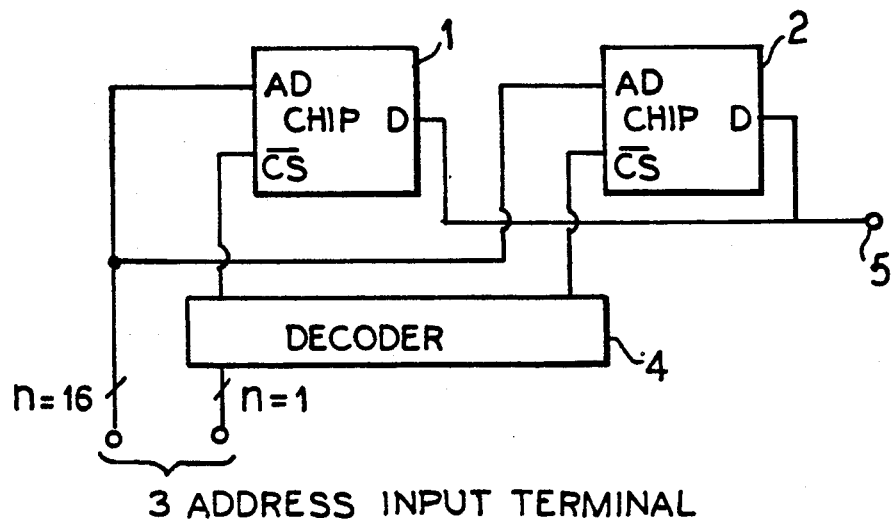
FIG. 1 is a block diagram of an embodiment of a static RAM having two chips.

Referring now to the drawings, particularly to FIG. 1, a static random-access memory, according to the present invention, is comprised of two chips (1) and (2). For example, each of the chips (1) and (2) may have 64K bit memories so the static RAM therefore totals 128K bits memory capacity. In this case, a 17-bit signal is used as an address signal to be supplied to address input terminals (3). The most significant bit thereof is used as a chip selection signal $\overline{CS}$ which is supplied to the chips (1) and (2) by means of a decoder (4), respectively, so as to select which one of the chips is to be used. The other 16-bits are used as an address signal AD for memory-cell selection to be supplied to the selected chip (1) or (2). Therefore, a data signal stored in one of the chips which is selected by the chip selecting signal, at the memory cell which is selected by the 16-bit address signal AD, are outputted to an output terminal (5).

Figure 2:
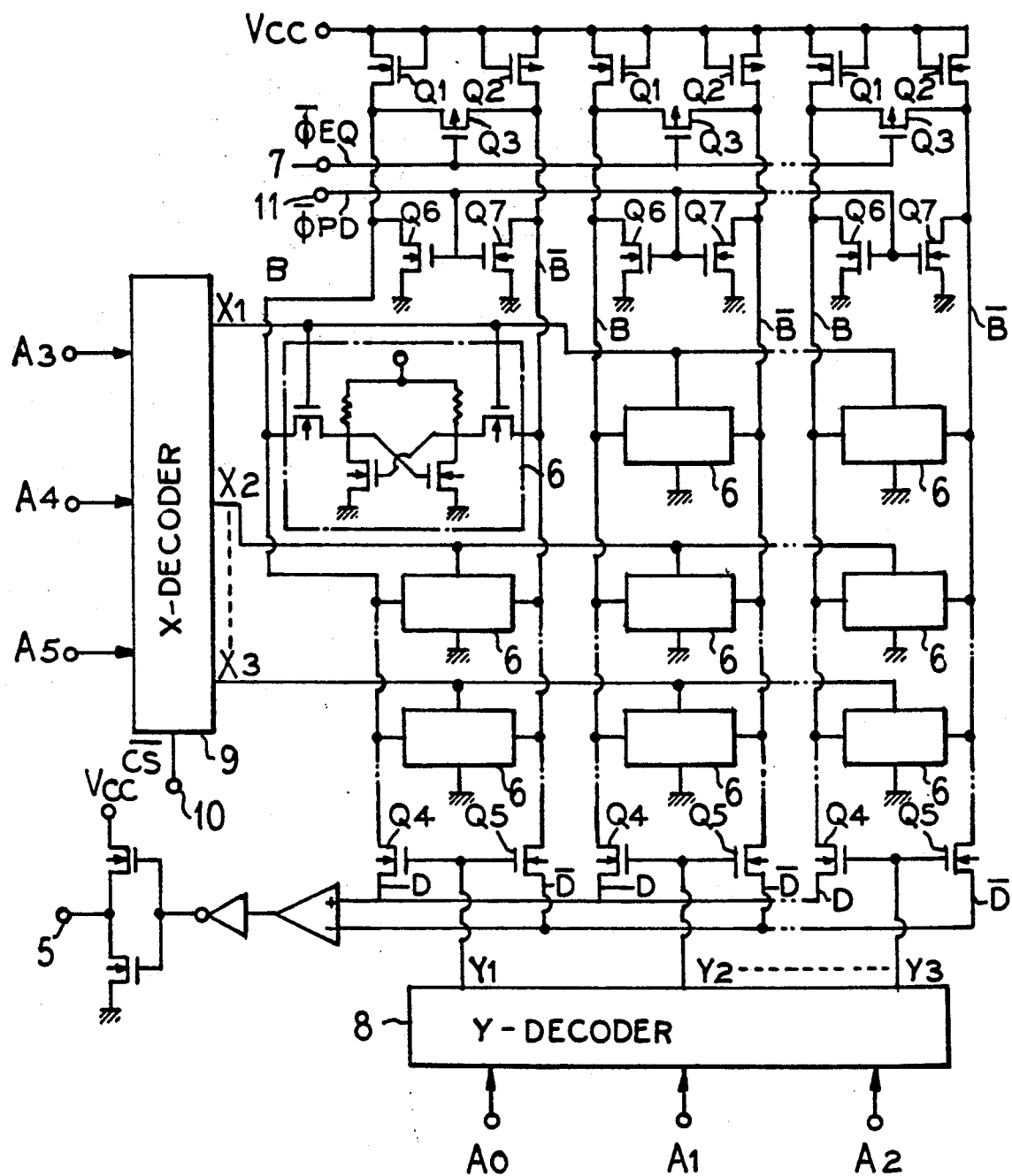
FIG. 2 is a block diagram of the preferred embodiment of a static RAM according to the invention.

In the preferred embodiment, as shown in FIG. 2, the chips (1) and (2) each include a plurality of, for example, 64 memory cells (6), the number of which is actually equal to the number of bits of memory capacity. The memory cells (6) each comprise a flip-flop circuit made of a MOSFET, respectively, and they are arranged in the form of a lattice. One of the memory cells (6) is selected by an address input signal comprising X (line) and Y (column) components.

In order to simplify the description of this static RAM, the construction of a column of the static RAM and its operation are described below.

In FIG. 2, a power supply terminal $V_{CC}$, from which, for example, 5 V direct current is supplied, is connected to one end of each of the bit lines B and $\bar{B}$ by means of n-channel MOSFETs $Q_1$ and $Q_2$ constituting loads, respectively. The other ends of the bit lines B and $\bar{B}$ respectively are each connected to a corresponding end of respective data lines D and $\bar{D}$ by means of n-channel MOSFETs $Q_4$ and $Q_5$ constituting column-selecting transistors. The other ends of the data lines D and $\bar{D}$ are, respectively, connected to data signal output terminal (5) by means of a common data line, output circuit and so forth. In this case, a given number of memory cells (6), for example, 8 memory cells are connected between the bit lines B and $\bar{B}$. The electric potential of the bit lines $\bar{B}$ is inverted relative to that of the bit lines B. That is, one is high level Hi when the other is low level Lo. The sources and drains of p-channel MOSFETs $Q_3$ constituting bit-line equalizing transistors are connected between the bit lines B and $\bar{B}$. Equalizing signals $\bar{\phi}_{EQ}$ are supplied from a equalizing signal input terminal (7) to the gates of the MOSFETs $Q_3$. When the equalizing signals $\bar{\phi}_{EQ}$ are supplied, current runs through the MOSFETs $Q_3$. In addition, address signals are supplied to a Y decoder (8) by means of half of the address-signal input-terminals $A_0$, $A_1$ and $A_2$ and to a X decoder (9) by means of the other half of address-signal input-terminals $A_3$, $A_4$ and $A_5$. In this case, when the address signal is comprised of 16 bits, 8-bits of the address signal are supplied to the Y decoder (8) and the X decoder (9), respectively. In addition, the Y decoder (8) supplies column selecting signals $Y_1$, $Y_2$, ---$Y_8$ to the junction between both gates of MOSFETs $Q_4$ and $Q_5$ which constitute column selecting transistors. The X decoder (9) supplies row selecting signals $X_1$, $X_2$, ---$X_8$ to given memory cells (6), respectively. When one of chips is selected, chip selecting signals $\overline{CS}$ inputted from the chip selecting signal input terminal (10) is supplied to the X decoder (9).

High-level electrical potential $V_{BH}$ of the bit lines B and $\bar{B}$, when static RAM is read out, can be expressed by the following formula:

$$V_{BH} = V_{CC} - (V_{TH} + \Delta V_{TH})$$

in which the $V_{CC}$ is power voltage, and the $V_{TH}$ is threshold voltage of the MOSFETs $Q_1$ and $Q_2$ and the $\Delta V_{TH}$ is the increase of threshold voltage by the body effect (the substrate effect). For example, when the $V_{CC}$ is 5 V, the $V_{TH}$ is 0.7 V and the $\Delta V_{TH}$ is 0.9 V, the $V_{BH}$ is 3.4 V. In this case, the electrical potential $V_{BL}$ of the low-level Lo bit line is, for example, 3.0 V. On the other hand, the electrical potential of the data lines D and $\bar{D}$ are higher than the electrical potential of the bit lines B and $\bar{B}$ so that high-speed operation can be performed. For example, it is established that the high-level Hi electrical potential is 4 V and the low-level Lo electrical potential is 3.7 V. Therefore, the high-level Hi column selecting transistors $Q_4$ and $Q_5$ are OFF.

Figure 3:
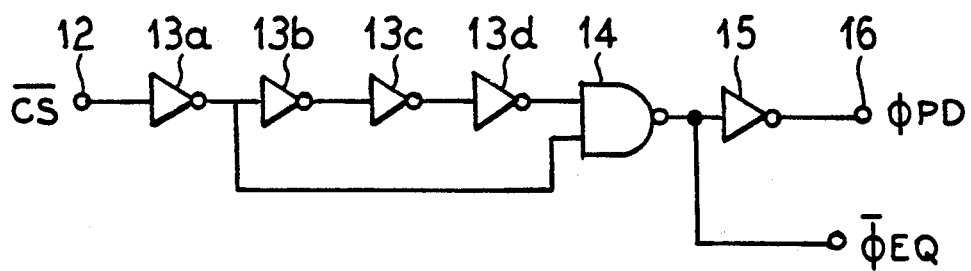
FIG. 3 is a block diagram of the preferred embodiment of a pull-down signal producing circuit according to the invention.

In this preferred embodiment, the bit lines B and $\bar{B}$ are connected to the drains of n-channel MOSFETs $Q_6$ and $Q_7$ constituting voltage control circuits (pull-down circuits). The sources of the MOSFETs $Q_6$ and $Q_7$ are connected to ground. In addition, the gates of the MOSFETs $Q_6$ and $Q_7$ are connected to each other. The junction of the gates is connected to a pull-down signal input terminal (11), to which pull-down signals are supplied when one of the chips is selected. In this case, the pull-down signals $\phi_{PD}$ are produced by a pull-down signal producing circuit (FIG. 3) which includes a chip selecting signal input teminal (12), to which the chip selecting signals are supplied. The chip selecting signal input terminal (12) is connected to one input terminal of a NAND circuit (14) by means of four inverter circuits (13a), (13b), (13c) and (13d). The other input terminal of the NAND circuit (14) is connected to the output of the first inverter (13A) and the output of the NAND circuit (14) is connected through an invertor (15) to a pull-down signal output terminal (16). In this case, the inverter circuits (13b), (13c) and (13d) constitute a time-delay circuit. For example, when chip selecting signals $\overline{CS}$ shown in FIG. 4A are supplied to the chip selecting signal input terminal (12), the pull-down signal output terminal (16) produces pull-down signals shown in FIG. 4C.

When selecting an address of the static RAM shown in FIG. 2, address signals AD shown in FIG. 4A, and the low-level chip selecting signal $\overline{CS}$ are detected to produce equalizing signals $\bar{\phi}_{EQ}$ shown in FIG. 4D. Respsonsive to the equalizing signals $\bar{\phi}_{EQ}$, the electrical potentials of the bit lines B and $\bar{B}$ are, as shown in FIG. 4G, the intermediate potential between the high-level Hi electrical potential and the low-level Lo electrical potential, which is, for example, 3.2 V when the high-level Hi and low-level Lo electrical potentials are 3.4 V and 3.4 V, respectively. Therefore, both column selecting transistors $Q_4$ and $Q_5$ are ON. In this case, the electrical potential of each of the data lines D and $\bar{D}$ is, as shown in FIG. 4H, the intermediate potential between the high-level Hi and low-level Lo electrical potentials, which is, for example, 3.85 V when the high-level Hi and low-level electrical potentials are 4 V and 3.7 V, respectively. At this time, the data signal is outputted from the memory cell which is selected by column-selecting signal and line-selecting signal shown in FIG. 4B, which signals are produced from the Y and X decoders (8) and (9), respectively, and the data signals are rapidly transferred to the data lines D and $\bar{D}$ from the bit lines B and $\bar{B}$. These data signals are supplied to the data output terminal (5) by means of a common data line and so forth.

Figure 4:
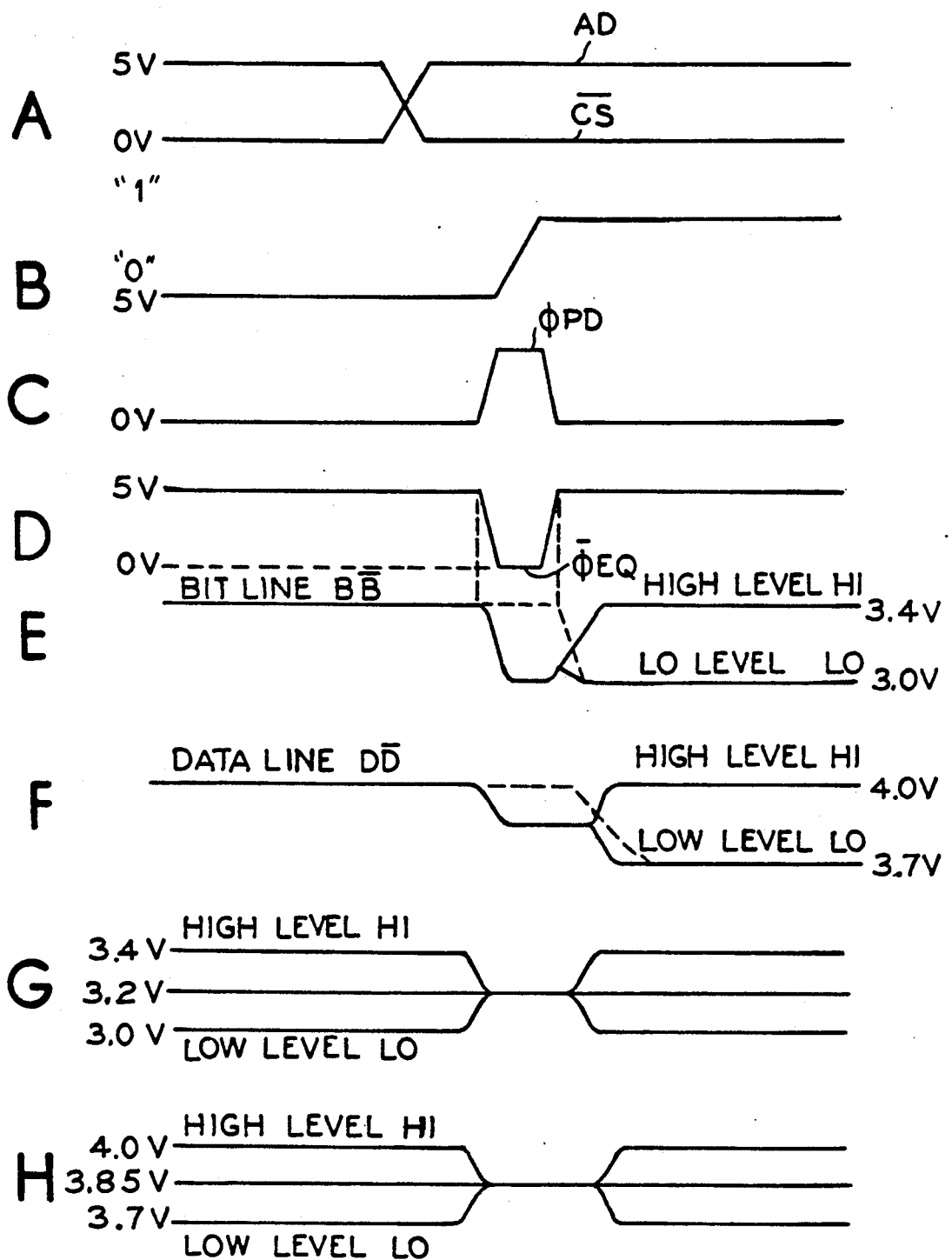
FIG. 4 is a timing chart for the static RAM in FIG. 2.

In addition, when selecting a chip, pull-down signals $\phi_{PD}$ shown in FIG. 4C and bit-line equalizing signals $\bar{\phi}_{EQ}$ shown in FIG. 4D are produced by the chip selecting signals $\overline{CS}$, and the pull-down signals $\phi_{PD}$ are supplied to the pull-down signal input terminal (11). The equalizing pulses are inverted relative to the pull-down signals, as shown in FIG. 4. Therefore, the MOSFETs $Q_6$ and $Q_7$ which constitute the pull-down circuit, connected to the bit lines B and $\bar{B}$, are ON when the pull-down signals $\phi_{PD}$ are supplied. As a result, as shown in FIG. 4E, the electrical potentials of the bit lines B and $\bar{B}$ are decreased below, for example, 3.2 V which is the electrical potential at which the column-selecting transistor $Q_4$ and $Q_5$ turn ON. At this time, the electrical potentials of the data lines D and $\overline{D}$ become the intermediate potential as shown in FIG. 4F, for example, 3.85 V, between the high level Hi and low-level Lo. At this time, since the equalizing signals $\phi_{EQ}$ have the operating potential shown in FIG. 4D, the aforementioned operation is performed to allow the transistors $Q_4$ and $Q_5$ of the chips (1) and (2) to have electrical potentials by which the transistors $Q_4$ and $Q_5$ are operated. At this time, data signals are outputted to the bit lines B and $\overline{B}$ from the memory cell, which is selected by the column-selecting signals and the line-selecting signals produced from the Y and X decoders (8) and (9), respectively, and rapidly transferred to the data lines D and $\overline{D}$. As a result, when the chip selecting operation is also performed, data signals can be transferred at the same speed as in cases where only an address is selected. As a result, large capacity, high-speed, static RAMs having a plurality of chips can be manufactured.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in appended claims.

What is claimed is:

1. A static random-access memory device having a plurality of chips, each chip having a chip-select input, comprising, in combination:
    a plurality of memory cells provided in each of said chips for storing data;
    column-selecting transistors provided in each of said chips;
    bit-lines, means for connecting said bit lines to said plurality of memory cells and to said column-selecting transistors;
    a voltage control circuit connected to said bit lines and responsive to a signal on said chip select input for adjusting the electrical potential of said bit-lines so as to allow said column-selecting transistor to operate only when selecting one of said chips for writing or reading; and
    said voltage control circuit comprises a pull-down circuit having two n-channel MOSFETs, means connecting the drains of said MOSFETs to said bit-lines, means connecting the sources of said MOSFETs to ground, and means connecting the gates of said MOSFETs to a pull-down signal input terminal, to which pull-down signals are supplied by means of a pull-down signal producing circuit when one of said chips is selected.

2. A static random-access memory device as set forth in claim 1, wherein said pull-down signal producing circuit comprises inverter circuits and a NAND circuit.

3. A static random-access memory device as set forth in claim 1, wherein said pull-down signal producing circuit comprises:
    a chip-selecting signal input terminal, to which chip-selecting signals are supplied;
    a NAND circuit, means connecting on input terminal of said NAND circuit to said chip-selecting signal input terminal by means of first, second, third and fourth inverter circuits, in series, and means connecting the other input terminal of said NAND circuit to the output of said first inverter circuit; and
    a pull-down signal output terminal connected to the output of said NAND circuit.

4. A static random-access memory device as set forth in claim 3, wherein said inverter circuits constitute a time-delay circuit.

* * * * *